United States Patent [19]

Chattopadhay

[11] Patent Number: 5,129,918
[45] Date of Patent: Jul. 14, 1992

[54] CUBIC BORON NITRIDE (CBN) ABRASIVE TOOL

[75] Inventor: Ajay K. Chattopadhay, Hauterive, Switzerland

[73] Assignee: Centre Suisse d'Electronique et de Microtechnique S.A., Switzerland

[21] Appl. No.: 776,644

[22] Filed: Oct. 15, 1991

[30] Foreign Application Priority Data

Oct. 12, 1990 [GB] United Kingdom ............... 9022191

[51] Int. Cl.⁵ ........................... C09K 3/14; C09C 1/68
[52] U.S. Cl. ................................ 51/295; 51/309
[58] Field of Search ................... 51/293, 295, 309

[56] References Cited

U.S. PATENT DOCUMENTS

| | | | |
|---|---|---|---|
| 3,248,189 | 4/1966 | Harris, Jr. | 51/295 |
| 3,378,361 | 4/1968 | Harris, Jr. | 51/309 |
| 3,615,309 | 10/1971 | Dawson | 51/295 |
| 3,868,235 | 2/1975 | Held | 51/309 |
| 3,894,673 | 7/1975 | Lowder et al. | 51/309 |
| 4,011,064 | 3/1977 | Lee et al. | 51/295 |
| 4,018,576 | 4/1977 | Lowder et al. | 51/309 |
| 4,063,909 | 12/1977 | Mitchell | 51/295 |
| 4,225,322 | 9/1980 | Knemeyer | 51/295 |
| 4,239,502 | 12/1980 | Slack et al. | 51/295 |
| 4,399,167 | 8/1983 | Pipkin | 51/309 |
| 4,776,862 | 10/1988 | Wiand | 51/295 |
| 5,024,680 | 6/1991 | Chen et al. | 51/295 |
| 5,030,596 | 7/1991 | Kume et al. | 51/309 |

Primary Examiner—Karl Group
Assistant Examiner—Deborah Jones
Attorney, Agent, or Firm—Parkhurst, Wendel & Rossi

[57] ABSTRACT

A monolayer CBN tool is fabricated by coating CBN grits with carbides of transition metals directly by CVD to make the surface metallurgically compatible to readily and commercially available brazing alloys known for their strength and durability.

9 Claims, No Drawings ature at least equal to the liquidus temperature of the

CUBIC BORON NITRIDE (CBN) ABRASIVE TOOL

BACKGROUND OF THE INVENTION

In recent years grinding has gained its significance as a stock removal process for shaping and sizing both hard and soft materials in contrast to what was realized in the past as a metal finishing operation and a process to be worked on very hard materials. To meet the ever increasing demand for improved productivity in the field of grinding, various new techniques have been introduced and are being investigated. These processes basically intended to provide for high rate stock removal, with improved work piece quality and prolonged grinding wheel life.

One of the most important requirements to be satisfied by the grinding wheels is free cutting action. This necessitates availability of large chip clearance volume ahead of individual crystals which clearly indicates that the gap between the adjacent grits in the direction of cutting should be wide enough. At the same time the protrusion of the grit above the bond should be large enough. Along with these conditions another requirement to be fulfilled is that the bond between grits and matrix should be strong to retain the grit throughout its useful life. The bonding material should have desirable mechanical properties like strength, hardness, low adhesion, low solubility in the ground material, and resistance to yielding during actual grinding.

The most cost effective method of preparing such a working surface of a wheel is the well known galvanic process. The galvanic process consists of interlocking the abrasive particles by galvanic deposition of metal like Ni or Co on a steel support (steel hub or steel mandrel). To date galvanic wheels with steel mandrels are the only type that can be used at a very high speed for safety reasons. But such wheels also suffer from several weaknesses. For effective retention of the grits in the bond, the grits are covered up to 60-80% of their height thus reducing the space for chip disposal. In addition, lump formation of material in the form of nodules is a common feature in the surface of such tools which further reduces the space in between the adjacent grits. Thus the galvanically bonded tool often fails to offer free cutting action.

It is understandable that effective bonding can be made even with less amount of binder if it is chemical or metallurgical in nature as obtained in liquid phase bonding or brazing. Such a process is disclosed in U.S. Pat. No. 4,239,502. A suitable process is to first coat the CBN particles with a silver base alloy, coat the surface of the rim portion of metal wheel and then clamp the coated CBN particles to the coated rim while applying heat to bond. The main shortcoming of the process is the complicacy in practicing the process of grit coating and obtaining separated grits. It is important that grits must be separated from one another before brazing and should not remain as a cluster of grits. Moreover, metal coated grits will generate large force and temperature as a result of metal-metal contact during grinding.

Methods of applying and metallurgically bonding hard carbide particles on the surface of a metal substrate are disclosed in U.S. Pat. Nos. 3,868,235; 3,378,361; 3,615,309; and 3,248,189. The bonding materials are mainly Ni-Cr base alloy containing other elements like Fe, B, Si and in most cases can be obtained commercially. It has been found that inclusion of Mo and Co in these alloys improves the bond provided by the matrix (U.S. Pat. No. 3,248,189). Cobalt-chromium-tungsten type "Stellite" alloys are also suitable (U.S. Pat. No. 3,615,309).

Diamond abrasive tools with a monolayer of abrasive grits, and a method of their manufacture are disclosed in U.S. Pat. Nos. 3,894,673 and 4,018,576. The methods utilize readily available, very hard and durable brazing alloys which are found to readily wet untreated diamond surfaces.

Another Pat.(No. PCT/US83/01946) teaches a method of making a monolayer abrading tool with tungsten carbide particles. A tape of powdered brazing material blended into a soft, flexible matrix is first secured to a steel substrate. Later the abrasive particles are imbedded to the tape. The tool is heated to a temperbrazing material to set the abrasive particles and then the tool is cooled rapidly to solidify the brazing material to produce a metallic matrix.

The shortcoming of such tools is that they cannot be used for grinding steel because of vigorous reactions between the work material and the abrasive particles causing rapid wear. In addition, the brazing materials disclosed in the above-mentioned patents are apparently limited to the bonding of hard carbide and diamond particles. Nothing is disclosed on joining of CBN by the processes disclosed or materials used.

The present investigators have found that the Ni base alloys containing Cr which braze effectively uncoated diamond below 1200° C. cannot provide a strong bond for CBN. The grinding experiments showed that CBN tools fail because of premature grit dislodgement due to poor adhesion between the bond and grit surface. The situation does not change when the amount of Cr in the alloy is raised to 25%. Thus it can be realized that Ni-Cr alloys cannot braze CBN grits because of the fact that Cr cannot effectively act as a wetting agent or react with the CBN surface under the brazing conditions. The inability of Cr to react with the CBN surface has also been established by the present inventors from the discovery of the fact that from gas phase reaction Cr cannot be deposited on CBN, whereas Cr can be deposited easily by the same CVD process on diamond through formation of chromium carbide at the interface even at 900° C.

A recently published patent (U.S. Pat. No. 4,776,862) discloses a method of fabrication of a monolayer diamond tool by precoating diamond particles with carbide forming metal, e.g., Fe, Cr and Mo, which form carbides of the elements when heat treated. The carbides facilitate wetting of diamond surfaces by the braze alloy. Precoating is done by wetting the abrasive particles with mineral oil or organic binder and then applying fine carbide forming metal powders. The coating process is cumbersome in the sense that it is very difficult to obtain discrete abrasive particles after precoating. This is of particular importance for fabricating a tool having a monolayer configuration. Uniform coating of the entire surface of the abrasive particle is also not very easy when finer grits are used. The fundamental limitation of the process is that elements like Fe, Cr, Mo cannot react with CBN as effectively as they can with diamond producing wettable carbides. CBN is more chemically stable than diamond and instead of carbides, borides or nitrides form if any reaction takes place. Borides and nitrides are definitely less wettable than the respective carbides. Therefore the above disclosed process is so limited in scope that it cannot be used to braze diamond. Thus there remains a need for a low cost practical method for brazing a monolayer of CBN grits to a steel substrate.

SUMMARY OF THE INVENTION

It is an object of the present invention to provide know-how which can be readily practiced on an economically feasible level to manufacture CBN grinding wheels which can efficiently satisfy the requirements of modern grinding techniques like creep feed, fast feed grinding, and the like.

It is another object of the present invention to provide a method of bonding a monolayer of CBN crystals with readily and commercially available brazing filler metals which are best known for their strength, hardness, resistance to plastic deformation, but which unfortunately cannot wet and bond, highly chemically stable materials like CBN.

Another object of the present invention is to provide a method for changing the surface chemistry of CBN particles without adversely affecting their grinding capability.

Another object of the present invention is to change the surface chemistry of CBN crystals by depositing a thin film of material or materials which should have good adherence with CBN. On the other hand the film deposited should enhance the wettability and bondability of the "chemically inert" CBN by the readily available conventional filler metals.

Still yet another object of the present invention is to provide an economically feasible method of deposition of aforementioned film on CBN crystals which can be employed for production of coated grits with a very high degree of reliability.

DETAILED DESCRIPTION OF THE INVENTION

During the course of the invention it was discovered that a thin film of TiC, which is mainly used in cutting tools and other tribological applications and which is deposited mainly on cemented carbide, ceramic and steel substrates by the well known CVD process, can be deposited on CBN particles by the same well established CVD process with a view to changing the surface chemistry of CBN thus enabling it to bond with Ni base alloys. Similarly, carbides of elements like Zr or Hf can also be deposited by CVD.

Similarly a secondary coating of carbide of elements of group VIA like Cr, Mo, W also can be deposited by CVD in order to bring about a change in the surface chemistry and to make the surface metallurgically compatible to the brazing alloy. The advantage of using CVD for such coating can be well realized for its better throwing power, ability to coat grain like substrates with irregular shapes with much better uniformity than any other process, and overall economy. The coated particles can be obtained as discrete ones and can be readily used for bonding.

Since the coated film is not metal, but rather, carbides of transition metals, such film of 1-2 micron thickness cannot adversely affect the grinding capability of CBN particles and such pregrinding operations like opening up of wheel or removal of coating from the surface is not necessary.

It was interesting to discover that the alloys which just fail to wet and bond effectively uncoated CBN crystals readily cling to the surface of the carbide coated CBN grits when brazing is carried out below 1200° C. just for 5-10 minutes under argon atmosphere.

The fabrication process can be divided into two parts:
A) Coating the CBN particles with hard metal carbides, preferably not above 1200° C. to avoid any thermal degradation of CBN grits.
B) Brazing the coated CBN particles with alloys preferably Ni-base alloys and preferably below 1200° C.

One can have a further understanding of the present invention from the following examples, which are in no way intended to limit the scope of the present invention.

COATING OF CBN GRITS BY CVD

Example I

CBN particles of sizes B251, B126 and B91 are placed in sieves having mesh sizes smaller than the respective grit sizes. The sieves are placed inside a vertical CVD reactor. Temperature of the reactor is kept at 1100° C. To deposit TiC, a mixture of $H_2$, $TiCL_4$ is passed over the CBN grits. Typical process parameters are: $H_2$ flow rate 10 1/min, and $CH_4$ flow rate 250 ml/min. Concentration of $TiCl_4$ is 2%. The system pressure is 100 Torr. The deposition is continued at 1100° C. for 60 minutes. After completion of deposition the reactor is cooled down under argon atmosphere to 50° C. The discrete coated grits are obtained. Microscopic examination reveals that coating is both adherent as well as coherent.

The process parameters used in this example are typically that of a standard CVD process and are merely illustrative and should not be considered as the limitation of the process. There can be available many other process parameters and conditions well standardized for CVD of TiC and can be used for deposition on CBN grits with a view to change the surface chemistry along with a strong film-grit interface without deviating from the basic objective of the invention.

Example II

To obtain a further layer of chromium carbide over TiC coating deposited on CBN, the process is carried out in the following way. At the top of the reactor Cr granules are kept and HCL vapor is carried over these granules in a stream of argon to generate $CrCl_2$. $CH_4$ is carried by $H_2$ and its entry point into the reactor is kept below the level where Cr granules are placed. Chromium carbide is formed as a result of reaction between $CrCl_2$ and $CH_4$ and is deposited on the TiC film of CBN grits. The exact type of chromium carbide depends on concentration of $CrCl_2$ and flow rate of $CH_4$. A typical deposition condition can be stated as follows:

Reactor temperature: 1000° C.
Flow rate of HCL: 0.25 1/min
Flow rate of argon: 5 1/min
Flow rate of $H_2$: 1 1/min
Flow rate of $CH_4$: 0.25 1/min
Deposition time: 30 min

BRAZING OF CBN GRITS TO A STEEL SUBSTRATE

The suitable brazing materials are principally Ni-base and Co-base alloys which are available commercially for example from Wall Colmonoy Corporation of Detroit, Mich. or from Degussa AG, Hanau of West Germany. There can be other manufacturers of braze alloys. It should be understood that in the following examples of brazing, the alloys used are commercially available and the composition of the alloys are simply illustrative in nature and should not be considered as restrictions of the process. Many alterations in the composition can be possible without departing from the basic objectives of the invention or the principle of the invented process. In principle all Ni base alloys with melting points of 1200° C. can be used provided they are able to wet and bond the outermost carbide coating on CBN grits. The selection of a particular braze alloy may depend on the specific requirement of a tool such as mechanical strength of the bond, wear resistance, etc.

Similarly, selection of brazing temperature and time may depend on the brazing material'melting point, fluidity, reactivity with the film deposited on the CBN grits. It is apparent that brazing parameters should be chosen only to allow restricted reaction at the braze-film interface so that required wetting and bonding are achieved and no detrimental brittle phase is formed at the interface as a result of vigorous reactions between the braze alloy and the film material under a brazing temperature-time combination.

Example III

The brazing material containing 76% Ni, 14% Cr and 10% P (Nicrobraz 50/Degussa 897) available in the form of a paste is applied on a steel substrate. The CBN grits coated with a coating of TiC are then applied on the braze layer uniformly in a single layer. The assembly is placed in a furnace chamber which is then evacuated to $10^{-1}$ Torr by a rotary pump. The pump is then stopped and the system is back filled with argon until the pressure becomes above atmospheric. This is followed by opening of the system to atmosphere. The flow rate of argon is 5 l/min and 10% $H_2$ was added in the gas flow. The furnace is heated to 1040° C. and kept at that temperature for 5 minutes. This is followed by cooling under the same atmosphere. The tool thus produced consists of a monolayer of CBN crystals firmly bonded to the steel substrate.

Example IV

The brazing process of Example III is again carried out, except that TiC coated CBN grits of size B251 are applied on the braze layer in a regular pattern. After brazing, the coated grits are seen to be held not only strongly by the bonding matrix but a better uniformity of bond level in the space between the grits is obtained than in Example III.

Example V

The brazing process is carried out in the similar way where the brazing material is Cr free and contains 90% Ni and 10% P (Nicrobraze 10/Degussa 876). After brazing the coated CBN grits are seen to be held strongly by the bonding matrix.

Example VI

The brazing process is carried out in the same way as that of Example III but the brazing material contains 25% Cr, 65% Ni and 10% P (Nicrobraze 51). The brazing temperature was kept at 1050° C. After brazing the coated CBN grits are seen to be held tenaciously by the braze to the steel member.

Example VII

Steps of Example III are carried out except that the outermost layer of the composite coating is chromium carbide and the brazing alloy consists of 82.4% Ni, 7% Cr, 3% Fe, 4.5% Si, 3.1% B (Nicrobraz LM/Degussa 1002). Brazing temperature is 1050° C. The brazing alloy readily wets the chromium carbide film and strongly bonds the CBN crystals.

Example VIII

Coated CBN grits of Example VII are used with the brazing alloy containing 74% Ni, 14% Cr, 4.5% Fe, 4.5% Si, 3% B (Nicrobraz 125/Degussa 104). The steps of the Example III are followed at a brazing temperature of 1080° C. Satisfactory wetting is achieved after brazing.

Example IX

Coated CBN grits of Example VII are used with a Cr free brazing alloy containing 92.5% Ni, 4.5% Si and 3% B (Nicrobraz 130/Degussa 1041). The steps of Example III are followed at a brazing temperature of 1080° C. resulting in satisfactory wetting and bonding of coated CBN grits.

Two exemplary applications of the inventive cutting tools will be explained below.

APPLICATION I

The product resulting from the practice of the invention represents a significant advancement in the construction of monolayer CBN tools. This advancement can be easily realized when the performance of the prototype tool is compared with that of the galvanic tool of similar type.

| | Results of comparative grinding tests. | | |
|---|---|---|---|
| Infeed | Galvanic tool A Grit size 250/212 μm | Galvanic tool B 250/212 μm | Tool fabricated as described in example III 250/212 μm |
| 10 μm | Satisfactory grinding | Satisfactory grinding | Satisfactory grinding |
| 20 μm | Force and power steadily increased followed by decrease and finally attained steady value. | Force and power steadily increased with grinding followed by decrease and finally attained steady value. | Force and power were very stable from the beginning. Magnitude of force and power were less than that developed by galvanic tool A and B. |
| | Normal force = 22N | 25N | 15N |
| | Power = 150 W | 174 W | 105 W |
| 30 μm | Force and power increased very fast within 1 mm cut. Severe wheel loading indicating failure of the grinding wheel. | Force and power increased very fast within 1 mm cut. Severe wheel loading indicating failure of the grinding wheel. | Steady grinding Normal force = 20 N Power = 156 W |
| 40 μm | Wheel was not used | Wheel was not used | Steady grinding 60 mm was removed from the workpiece. Normal force = 34N Power = 228 W |

Operation: Face grinding
Workpiece material: 100 Cr 6 Steel (hardness:290 HV)
Cutting speed: 30 m/s
Table speed: 2 m/min
Cutting fluid: 5% soluble oil, Castol Syntillo DC 282.

APPLICATION II

When grinding with galvanically bonded CBN wheels, a low cost method of improving the surface finish and accuracy of the workpiece is to shave the grit tips by a diamond tool. However, it is contended, "it is important that the grit tips are removed only in the μm range so that adequate chip clearance spaces are still available after the shaving process." In the view of this quotation from the paper of K. Yegenoglu and M. Roth appearing on page 116 of Industrial Diamond Review, vol. 3/87, it is understandable that shaving processes can only be used in a very restricted way in a galvanically bonded CBN wheel, so that necessary chip clearance space is not reduced. It might have been thought that such restricted shaving is a prerequisite for galvanically bonded CBN wheel for load free cutting.

On the other hand the product obtained as a result of the present invention offers significant advantages in this respect. More specifically, it can be said that much grit shaving allowance is provided in the product in order to achieve better surface finish and accuracy of the workpiece but without the risk of reduction of the chip clearance space.

The above mentioned advantage of the invented product can be demonstrated by the following experiment. Two CBN wheels were taken, one having galvanic bond and the second with brazed bond. The grit tips of the two wheels were shaved with a diamond tool by 10 μm. Both the wheels were submitted to grinding of unhardened 100 Cr 6 steel under the following conditions.

Operation: Face grinding
Wheel speed: 30 m/s
Table speed: 2 m/s
In-feed: 20 μm
Cutting fluid: 5% soluble oil Castrol Syntillo DC282

The shaved brazed wheel showed improved surface finish of the workpiece and grinding force and power were very stable from the beginning of cut. The shaved galvanic wheel showed progressive rise of force and power with grinding passes, and at the end of a 1mm cut severe wheel loading took place indicating failure of the grinding wheel.

What is claimed is:

1. A CBN abrasive tool, comprising a metal substrate and a single layer of CBN grits bonded to said metal substrate by a braze alloy, wherein the surface chemistry of said CBN grits is modified by depositing a film of carbide selected from the group of carbides containing transition metals consisting of group IVA, VA and VIA, said film being strongly adhered to crystal surfaces of said CBN grits.

2. The CBN abrasive tool of claim 1, wherein said braze alloy comprises Ni-base alloys which are incapable of wetting and bonding untreated CBN grits effectively below 1200° C., but are capable of wetting and bonding said CBN grits at temperatures below 1200° C. when surfaces of said CBN grits have been modified.

3. The CBN abrasive tool of claim 1, wherein said carbide film is deposited on said CBN grits by CVD at a temperature of 1200° C. or less.

4. The CBN abrasive tool of claim 3, wherein said carbide film is TiC.

5. The CBN abrasive tool of claim 3, wherein said carbide film comprises a first layer of TiC directly contacting said CBN grit and a second, outermost layer of chromium carbide contacting said TiC film layer.

6. A method of manufacturing a CBN abrasive tool, comprising the steps of:
   providing a metal substrate;
   providing a plurality of CBN grits;
   depositing a film of carbide on said CBN grits, said carbide being selected from the group of carbides containing transition metals consisting of group IVA, VA, and VIA; and
   bonding the carbide film-coated CBN grits to said metal substrate by a braze alloy.

7. The method of claim 6, wherein said carbide film is deposited on said CBN grits by CVD at a temperature of 1200° C. or less.

8. The method of claim 7, wherein said carbide film is TiC.

9. The method of claim 8, wherein said carbide film comprises a first layer of TiC directly contacting said CBN grit and a second, outermost layer of chromium carbide contacting said TiC film layer.

* * * * *